(12) United States Patent
Shikata et al.

(10) Patent No.: US 8,410,666 B2
(45) Date of Patent: Apr. 2, 2013

(54) ULTRASONIC PROBE AND METHOD OF MANUFACTURING THE SAME

(75) Inventors: Hiroyuki Shikata, Nasushiobara (JP); Satoru Tezuka, Nasushiobara (JP); Yasuhiro Ona, Nasushiobara (JP); Takashi Kubota, Otawara (JP); Yasuhisa Makita, Nasushiobara (JP)

(73) Assignees: Kabushiki Kaisha Toshiba, Tokyo (JP); Toshiba Medical Systems Corporation, Tochigi-Ken (JP)

( * ) Notice: Subject to any disclaimer, the term of this patent is extended or adjusted under 35 U.S.C. 154(b) by 120 days.

(21) Appl. No.: 13/111,246

(22) Filed: May 19, 2011

(65) Prior Publication Data

US 2011/0295124 A1 Dec. 1, 2011

(30) Foreign Application Priority Data

May 26, 2010 (JP) .................................. 2010-120885

(51) Int. Cl.
*H01L 41/08* (2006.01)
*A61B 8/14* (2006.01)
*G01M 7/00* (2006.01)

(52) U.S. Cl. ........................ 310/334; 600/459; 29/594

(58) Field of Classification Search .................. 310/334; 600/459; 29/594
See application file for complete search history.

(56) References Cited

U.S. PATENT DOCUMENTS

| 4,747,192 | A | * | 5/1988 | Rokurota | 29/25.35 |
| 5,329,498 | A | * | 7/1994 | Greenstein | 367/155 |
| 6,551,247 | B2 | * | 4/2003 | Saito et al. | 600/459 |
| 6,589,180 | B2 | * | 7/2003 | Erikson et al. | 600/459 |
| 7,572,224 | B2 | * | 8/2009 | Hosono et al. | 600/459 |
| 2010/0204583 | A1 | * | 8/2010 | Rhim et al. | 600/459 |

FOREIGN PATENT DOCUMENTS

CN 101797166 A * 8/2010

* cited by examiner

*Primary Examiner* — Thomas Dougherty
(74) *Attorney, Agent, or Firm* — Yoshida & Associates, LLC

(57) ABSTRACT

According to one embodiment, an ultrasonic probe includes a plurality of piezoelectric elements, a first electrode, a plurality of second electrodes, a plurality of stacked flexible printed circuit boards, and a plurality of connection portions. The plurality of piezoelectric elements are arrayed. The first electrode is provided on the emitting surface side of the plurality of piezoelectric elements. The plurality of second electrodes are respectively provided on the rear surface sides of the plurality of piezoelectric elements. The plurality of stacked flexible printed circuit boards respectively include a plurality of terminals. The plurality of connection portions electrically connect the second electrodes to the terminals. At least one of the flexible printed circuit boards extends longer than the flexible printed circuit board serving as an upper layer.

9 Claims, 12 Drawing Sheets

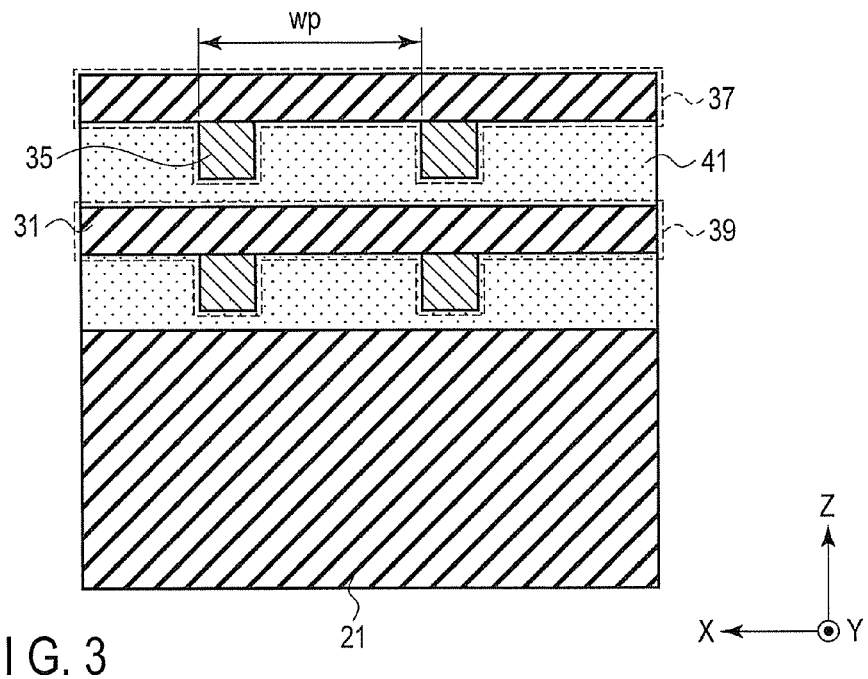
F I G. 3
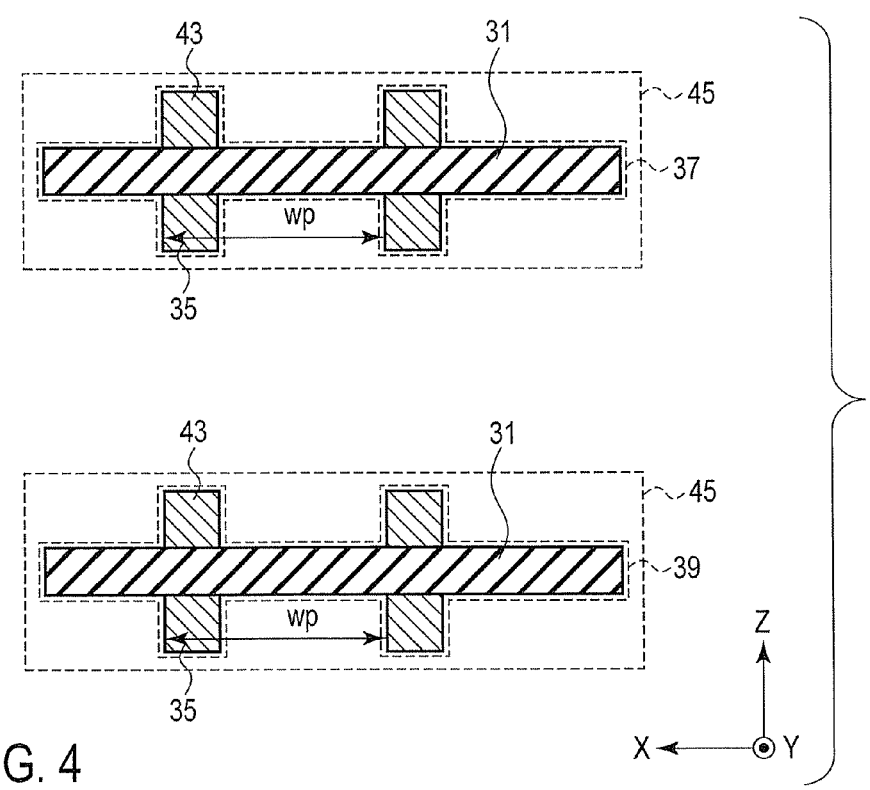
F I G. 4

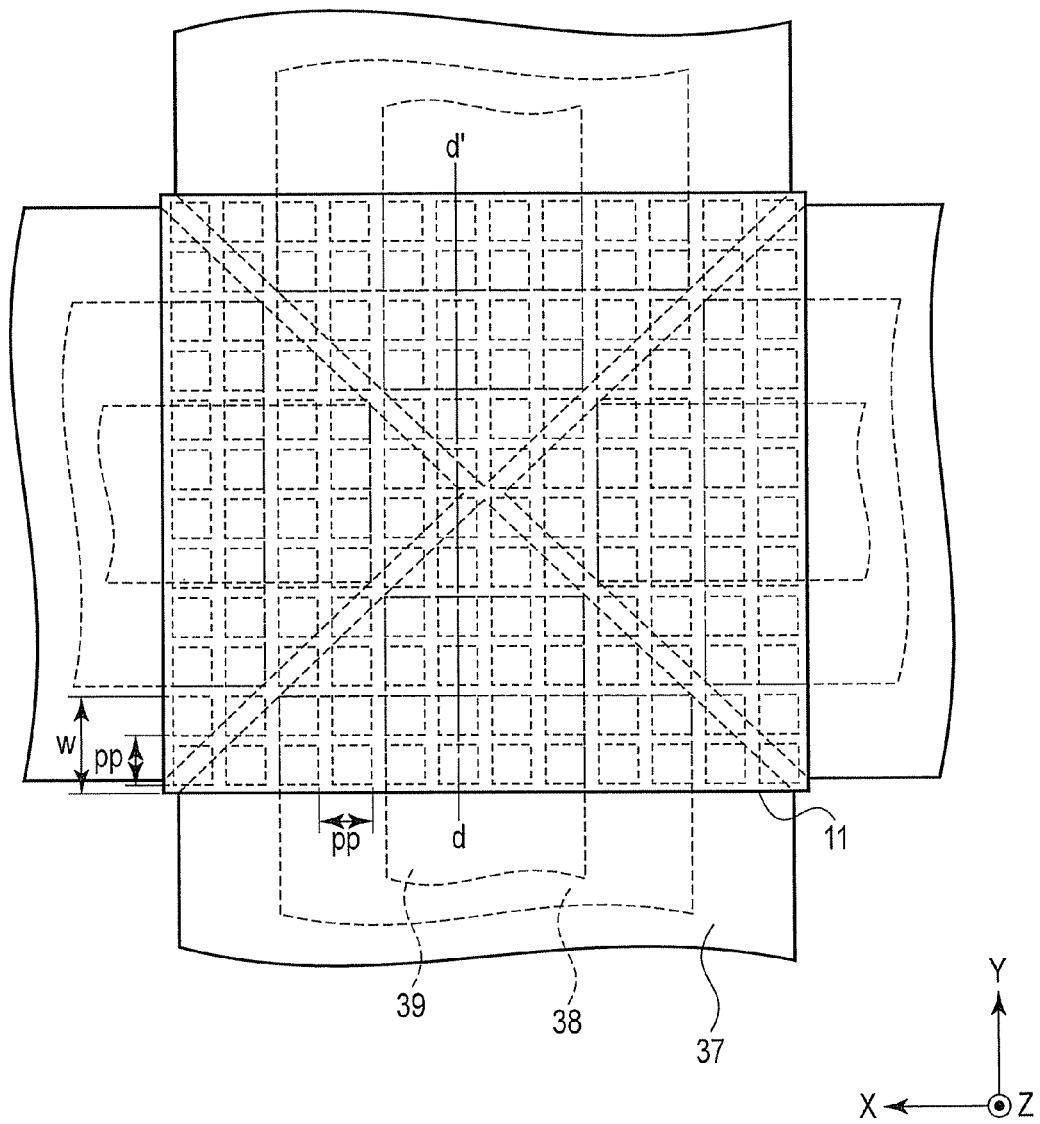
F I G. 10

ULTRASONIC PROBE AND METHOD OF MANUFACTURING THE SAME

CROSS-REFERENCE TO RELATED APPLICATIONS

This application is based upon and claims the benefit of priority from Japanese Patent Application No. 2010-120885, filed May 26, 2010; the entire contents of which are incorporated herein by reference.

FIELD

Embodiments described herein relate generally to an ultrasonic probe and a method of manufacturing the same.

BACKGROUND

Ultrasonic probes include a two-dimensional array probe having transducers arrayed in a two-dimensional lattice pattern. Since the number of transducers of a two-dimensional array probe is larger than that of a one-dimensional array probe, the two-dimensional probe needs to incorporate an integrated circuit (IC) associated with part of transmission/reception of ultrasonic waves. In this case, a flexible printed circuitboard (FPC) is sometimes placed on the rear surfaces of the transducers. The placed FPC is led from the rear surfaces of the transducers. The resultant FPC is connected to an IC-mounted board (referred to as an electronic circuit board hereinafter). In this case, it is necessary to output signals from the respective transducers. When outputting signals from all the transducers by using one FPC (for example, FIG. 11), the spacing between the traces of the FPC decreases. This may fail to obtain a proper ultrasonic image due to crosstalk between the traces. For this reason, some probes take a structure in which the overall two-dimensional array is divided into a plurality of modules (referred to as module division hereinafter) to provide FPCs for the respective modules, and the FPCs are sandwiched between the modules (for example, FIG. 12). There is also available a sparse technique of reducing the number of traces by reducing the number of transducers used for ultrasonic transmission/reception (for example, FIG. 13). On the other hand, some probes use, as an FPC structure, an FPC having insulators and wiring patterns stacked on each other (referred to as a multilayer FPC hereinafter).

When, however, performing module division, since the spacing between the transducers differs from the spacing between the modules, sidelobes occur, and a proper ultrasonic image may not be obtained. In addition, module division leads to an increase in cost due to increases in the number of parts and the number of manufacturing steps. The sparse technique may not obtain a proper ultrasonic image due to the adverse effects of sidelobes and the like on an acoustic field and a deterioration in sensitivity. A multilayer FPC leads to a high cost due to a complex manufacturing process. In addition, since the flexibility of a multilayer FPC is lower than that of a single-layer FPC, the multilayer FPC is difficult to handle in the ultrasonic probe. Furthermore, the multilayer FPC requires through-holes in the respective layers for electrical connection, and the through-holes cannot be used as wiring spaces. Therefore, the multilayer FPC is poor in efficiency in terms of wiring spaces.

BRIEF DESCRIPTION OF THE DRAWINGS

FIG. 3 is a sectional view taken along a line b-b' in FIG. 2 when viewed from the Y-direction;

FIG. 4 is a sectional view taken along a line c-c' in FIG. 2 when viewed from the Y-direction;

FIG. 10 is a view showing an ultrasonic probe according to the third modification of the first embodiment when viewed from the ultrasonic wave emitting surface side;

DETAILED DESCRIPTION

Figure 1:
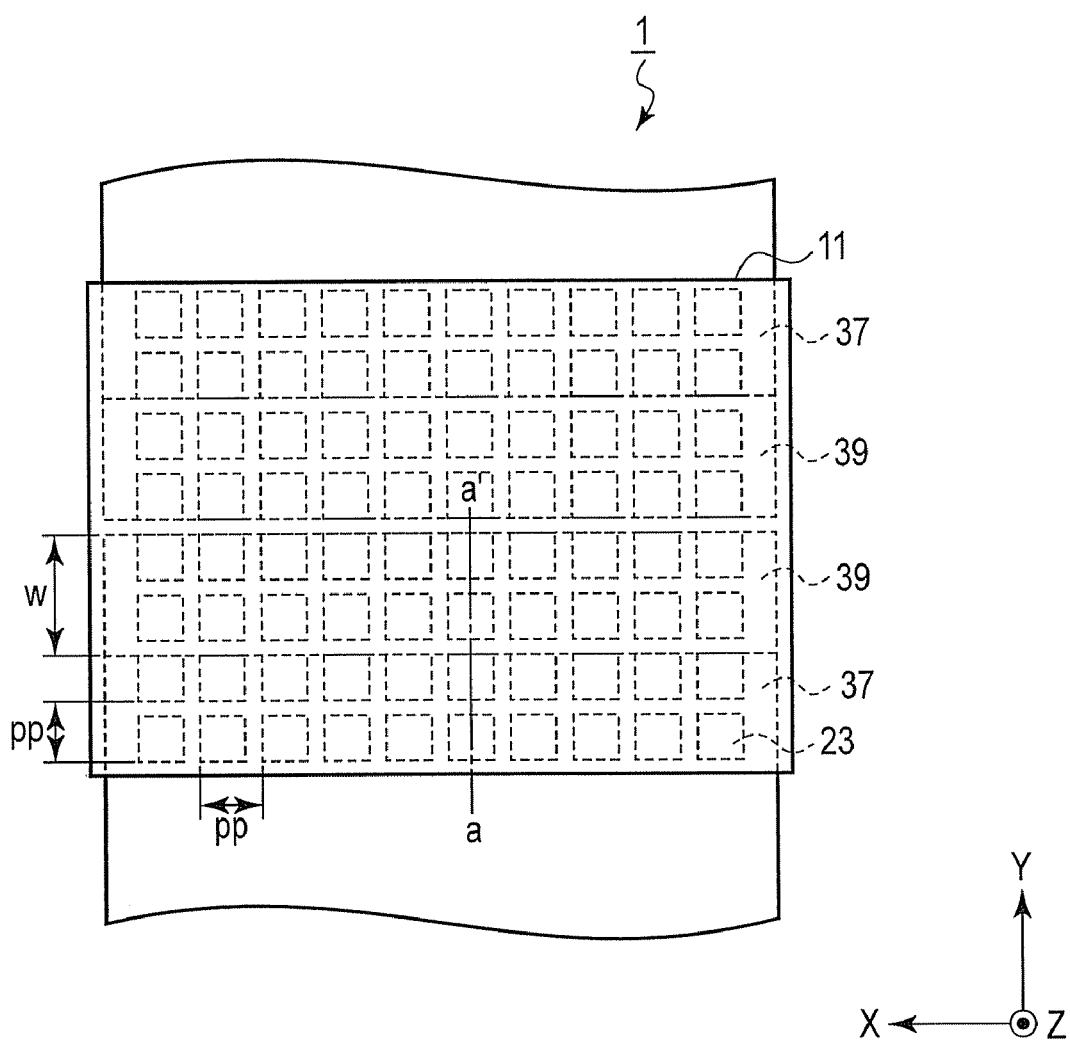
FIG. 1 is a view showing an ultrasonic probe according to the first embodiment when viewed from the ultrasonic wave emitting surface side.

In general, according to one embodiment, an ultrasonic probe includes a plurality of piezoelectric elements, a first electrode, a plurality of second electrodes, a plurality of stacked flexible printed circuit boards, and a plurality of connection portions. The plurality of piezoelectric elements are arrayed. The first electrode is provided on the emitting surface side of the plurality of piezoelectric elements. The plurality of second electrodes are respectively provided on the rear surface sides of the plurality of piezoelectric elements. The plurality of stacked flexible printed circuit boards respectively include a plurality of terminals. The plurality of connection portions electrically connect the second electrodes to the terminals. At least one of the flexible printed circuit boards extends longer than the flexible printed circuit board serving as an upper layer.

An ultrasonic probe according to this embodiment will be described below with reference to the views of the accompanying drawing. Note that the same reference numerals in the following description denote constituent elements having almost the same arrangements, and a repetitive description will be made only when required.

(First Embodiment)

FIG. 1 is a view showing an ultrasonic probe 1 according to the first embodiment when viewed from the ultrasonic wave emitting surface side. Referring to FIG. 1, the direction in which ultrasonic waves are emitted (the direction perpendicular to the drawing surface) is defined as a Z-axis. The direction which is perpendicular to the Z-axis and in which an FPC is led from the front surface of a backing member (not shown) is defined as a Y-axis. The direction perpendicular to the Z- and Y-axes is defined as an X-axis.

The arrangement of the ultrasonic probe 1 according to the first embodiment will be described with reference to FIG. 2.

Figure 2:
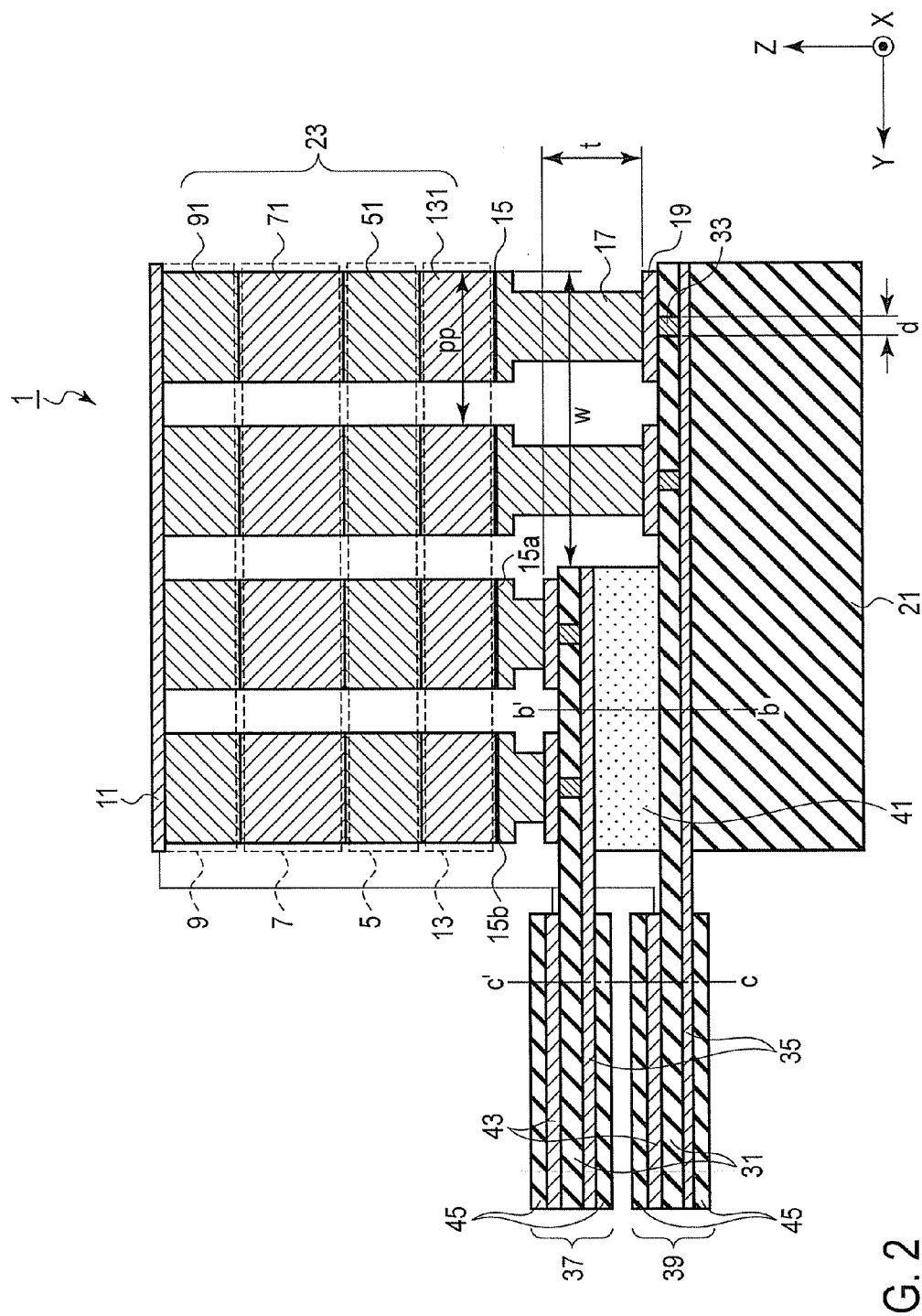
FIG. 2 is a sectional view of the ultrasonic probe according to the first embodiment in FIG. 1 taken along a line a-a' when viewed from the X-direction.

FIG. 2 shows an example of a cross-section of the ultrasonic probe 1 taken along a line a-a' in FIG. 1 when viewed from the X-direction. As shown in FIG. 2, the ultrasonic probe 1 includes a piezoelectric layer 5, a first acoustic matching layer 7, a second acoustic matching layer 9, a common electrode (first electrode) 11, an intermediate layer 13, individual electrodes (second electrodes) 15, connection portions 17, terminals 19, an upper layer FPC 37, a lower layer FPC 39, an adhesive layer 41, and a backing member 21.

The first acoustic matching layer 7 is joined to the front surface of the piezoelectric layer 5. The second acoustic matching layer 9 is joined to the front surface of the first acoustic matching layer 7. The intermediate layer 13 is joined to the rear surface of the piezoelectric layer 5. The second acoustic matching layer 9, first acoustic matching layer 7, piezoelectric layer 5, and intermediate layer 13 each are divided into a lattice pattern in an X-Y plane. The piezoelectric layer 5 is constituted by a plurality of piezoelectric elements 51 divided into a lattice pattern in the X-Y plane. The first acoustic matching layer 7 is constituted by a plurality of first acoustic matching elements 71 divided into a lattice pattern in the X-Y plane. The second acoustic matching layer 9 is constituted by a plurality of second acoustic matching elements 91 divided into a lattice pattern in the X-Y plane. The intermediate layer 13 is constituted by a plurality of intermediate elements 131 divided into a lattice pattern in the X-Y plane. An integral body obtained by joining the piezoelectric element 51, first acoustic matching element 71, second acoustic matching element 91, and intermediate element 131 along the Z-direction will be referred to as a transducer element 23 hereinafter. The individual electrodes 15 are respectively joined to the rear surfaces of the plurality of transducer elements 23. The common electrode 11 is joined to the front surfaces of the plurality of transducer elements 23. The dotted rectangles in FIG. 1 indicate the plurality of transducer elements 23 arrayed into a lattice pattern in the X-Y plane.

The plurality of terminals 19 are arranged at the front surfaces of the upper layer FPC 37 and lower layer FPC 39. Through-holes 33 extending through base layers 31 of the respective FPCs are provided at the rear surfaces of the plurality of terminals 19. A plurality of rear traces 35 of the respective FPCs are provided at the rear surfaces of the through-holes 33. Although the plurality of rear traces 35 in FIG. 2 each are drawn as if it were a single trace, the plurality of rear traces 35 are actually arranged in the X-direction.

The upper layer FPC 37 and lower layer FPC 39 located at the rear surfaces of the plurality of individual electrodes 15 are stacked on each other along the Z-direction. The stacked upper layer FPC 37 and lower layer FPC 39 are bonded to each other with a nonconductive adhesive. The bonded upper layer FPC 37 and lower layer FPC 39 are not electrically connected to prevent a reduction in the wiring density of each FPC. The backing member 21 is bonded to the rear surface of the lower layer FPC 39. FIG. 3 is a sectional view taken along a line b-b' in FIG. 2 when viewed from the Y-direction. The dotted frame in FIG. 3 indicates the upper layer FPC 37. The broken line frame in FIG. 3 indicates the lower layer FPC 39. The backing member 21, the base layers 31, and the adhesive layer 41 formed by the above adhesive in FIG. 3 have insulation properties. This maintains the insulation between the rear traces 35 of the upper layer FPC 37 and the rear traces 35 of the lower layer FPC 39 in FIG. 3. The bonded upper layer FPC 37 and lower layer FPC 39 are led from the front surface of the backing member 21 in the Y-axis direction.

After the upper layer FPC 37 and the lower layer FPC 39 are led from the front surface of the backing member 21 in the Y-axis direction, they are separated from each other. Front traces 43 are provided on the front surfaces of the base layers 31 of the separated upper layer FPC 37 and lower layer FPC 39. The trace led from the common electrode 11 is joined to the front traces 43. The separated upper layer FPC 37 and lower layer FPC 39 are respectively covered with cover-lays 45. The upper layer FPC 37 and lower layer FPC 39 in this embodiment are FPCs each having double-sided traces. As shown in FIG. 2, no front traces are provided on the front surfaces of the upper layer FPC 37 and lower layer FPC 39 at positions between the individual electrodes 15 and the backing member 21.

FIG. 4 is a sectional view taken along a line c-c' in FIG. 2 when viewed from the Y-direction. The dotted rectangular frame in FIG. 4 indicates the upper layer FPC 37 covered with the cover-lays 45. The broken line rectangular frame in FIG. 4 indicates the lower layer FPC 39 covered with the cover-lays 45. The cover-lays 45 in FIG. 4 have insulation properties. The upper layer FPC 37 and lower layer FPC 39 respectively covered with the cover-lays 45 in FIG. 4 are separated from each other. Separating the upper layer FPC 37 and the lower layer FPC 39 facilitates handling of the FPCs in the ultrasonic probe owing to the flexibility of each FPC, unlike a multilayer FPC.

The upper layer FPC 37 and lower layer FPC 39 covered with the cover-lays 45 are bent at nearly right angles at an end portion of the backing member 21 along the backing member 21. The plurality of rear traces 35 of the upper layer FPC 37 and lower layer FPC 39 covered with the cover-lays 45 are respectively connected to a plurality of electronic circuit boards (not shown) through board connection pads. Using a plurality of FPCs will reduce the connection areas between the FPCs and the electronic circuit boards as compared with the connection areas between the multilayer FPC and the electronic circuit boards. This can connect the respective FPCs to the electronic circuit boards without increasing the outer dimensions of the ultrasonic probe. The front traces 43 of the upper layer FPC 37 and lower layer FPC 39 covered with the cover-lays 45 are respectively connected to ground of the plurality of electronic circuit boards (not shown).

The plurality of individual electrodes 15 are respectively connected to the plurality of terminals 19 through the plurality of connection portions 17. The connected upper layer FPC 37 and lower layer FPC 39 are notched to expose the terminals 19 of the lower layer FPC 39 to the individual electrodes 15. Note that the bonded upper layer FPC 37 and lower layer FPC 39 may be arranged to expose the terminals 19 of the lower layer FPC 39 to the individual electrodes 15. A width w by which the upper layer FPC 37 is notched along the Y-direction is determined by a spacing pp between the transducer elements 23 in the X- and Y-directions, a diameter d of the through-hole 33, and a spacing wp between the plurality of rear traces 35.

The notching width w is determined, for example, in the following manner. The spacing (pp−d) between the through-holes is calculated by subtracting the diameter d of the through-hole 33 from the spacing pp between the transducer elements 23 in the X-direction. The number ((pp−d)/wp) of rear traces which can be positioned in the spacing (pp−d) between the through-holes is calculated by dividing the spacing (pp−d) between the through-holes by the spacing wp between the plurality of rear traces 35. The number ((pp−d)/wp+1) obtained by adding one to the number ((pp−d)/wp) of rear traces which can be positioned in the spacing (pp−d) between the through-holes is the number of rear traces. The notching width w is equivalent to the number (((pp−d)/wp+1)×pp) obtained by multiplying the number ((pp−d)/wp+1) of rear traces by the spacing pp between the transducer elements 23 in the Y-direction. For example, since the number of rear traces is 2, the notching width w in FIGS. 1 and 2 is given by 2×pp.

The piezoelectric layer 5 is, for example, a piezoelectric ceramic layer shaped into a rectangle.

The piezoelectric layer 5 generates ultrasonic waves upon receiving driving signals (electrical signals) from an ultrasonic diagnostic apparatus or ultrasonic flaw detector (not shown) via a plurality of electronic circuit boards (not shown). The piezoelectric layer 5 generates an echo signal (electrical signal) upon receiving ultrasonic waves reflected by an object or a substance subjected to ultrasonic flaw detection. The generated echo signal is supplied to the ultrasonic diagnostic apparatus or ultrasonic flaw detector via a plurality of electronic circuit boards (not shown). The piezoelectric layer 5 includes the plurality of piezoelectric elements 51 divided into a lattice pattern in the X-Y plane. The spacing between the piezoelectric elements 51 (referred to as the lattice spacing hereinafter) remains the same in the X- and Y-directions. Note that the lattice spacing may vary in the X- and Y-directions. For the sake of a concrete description, assume that the lattice spacing remains the same in the X- and Y-directions.

The first acoustic matching layer 7 and second acoustic matching layer 9 are provided in the Z-direction on the ultrasonic wave emission side of the piezoelectric layer 5. The first acoustic matching layer 7 and second acoustic matching layer 9 each are formed by an acoustic matching material such as a metal powder containing epoxy resin as a conductive material. It is possible to match the acoustic impedance of an object with that of the piezoelectric elements 51 by adjusting physical parameters such as sound velocities, thicknesses, and acoustic impedances associated with the first acoustic matching layer 7 and second acoustic matching layer 9. More specifically, the first acoustic matching layer 7 and second acoustic matching layer 9 suppress reflection of ultrasonic waves caused by the difference between the acoustic impedance of the object or substance associated with ultrasonic flaw detection and that of the piezoelectric layer 5. The first acoustic matching layer 7 includes the plurality of first acoustic matching elements 71 two-dimensionally arrayed along the X- and Y-directions. Each of the first acoustic matching elements 71 is joined to the front surface of a corresponding one of the piezoelectric elements 51. The second acoustic matching layer 9 includes the plurality of second acoustic matching elements 91 two-dimensionally arrayed along the X- and Y-directions. Each of the second acoustic matching elements 91 is joined to the front surface of a corresponding one of the first acoustic matching elements 71. Although FIG. 2 shows the two acoustic matching layers, this embodiment is not limited to them. For example, it is possible to place one, three, or four or more acoustic matching layers at the front surface of the piezoelectric layer 5 and join them to each other.

The common electrode 11 is joined to the front surface of the second acoustic matching layer 9. The common electrode 11 is joined to the plurality of second acoustic matching elements 91. Traces led from the common electrode 11 are connected to the front traces 43 of the upper layer FPC 37 and lower layer FPC 39. An acoustic lens (not shown) is placed on the front surface of the common electrode 11.

The intermediate layer 13 is provided on the rear surface side of the piezoelectric layer 5. The acoustic impedance of the intermediate layer 13 is higher than that of the piezoelectric elements 51 and that of the connection portions 17. This can reduce the acoustic influence on the connection portions 17 (described later) as compared with the case in which the acoustic impedance of the intermediate layer 13 is lower than that of the piezoelectric elements 51 and that of the connection portions 17. This reduces acoustic image disturbance and noise caused by the acoustic influence on the connection portions 17. The intermediate layer 13 includes the plurality of intermediate elements 131 two-dimensionally arrayed along the X- and Y-directions. Each of the plurality of intermediate elements 131 is joined to the rear surface of a corresponding one of the plurality of piezoelectric elements 51. Note that a modification of this embodiment can be configured without the intermediate layer 13.

The individual electrodes 15 are respectively joined to the rear surfaces of the plurality of intermediate elements 131. The individual electrode 15 is formed by, for example, metal plating using silver or gold or sputtering.

The layered FPCs located at the front surface of the backing member 21 differ in arrangement from the FPCs located between the position where they are led from the front surface of the backing member 21 and the position where they are respectively connected to a plurality of electronic circuit boards (not shown). The arrangements of the upper layer FPC 37 and lower layer FPC 39 located between the position where they are led from the front surface of the backing member 21 and the position where they are respectively connected to the plurality of electronic circuit boards (not shown) will be described first. The upper layer FPC 37 and lower layer FPC 39 each include the base layer 31, the plurality of rear traces 35 provided on the rear surface of the base layers 31, and the front trace 43 provided on the front surface of the base layer 31.

The base layer 31 is formed from a resin having insulation properties such as polyimide or polyester.

The rear trace 35 is a circuit trace formed on the rear surface of the base layer 31 by using, for example, a copper foil. The number of rear traces 35 is determined in accordance with the trace spacing wp and the diameter (pp−d) of the through-hole 33 (described below).

The front trace 43 is a circuit trace formed on the front surface of the base layer 31 by using, for example, a copper foil. The number of front traces 43 is equal to that of rear traces 35. Note that the number of front traces 43 may be one. The front traces 43 are joined to the trace led from the common electrode 11 immediately before the upper layer FPC 37 and lower layer FPC 39 are led to the front surface of the backing member 21.

The arrangements of the upper layer FPC 37 and lower layer FPC 39 located at the front surface of the backing member 21 will be described next. These FPCs each include the base layer 31, the plurality of rear traces 35 provided on the rear surface of the base layer 31, the plurality of terminals 19 provided on the front surface of the base layer 31, and the plurality of through-holes 33 through which the plurality of terminals 19 are electrically connected to the plurality of rear traces 35. This arrangement differs from that of the FPCs located, between the position where they are led from the front surface of the backing member 21 and the position where they are respectively connected to the plurality of electronic circuit boards (not shown) in that it includes the terminals 19, through-holes 33, and front traces 43.

The terminals 19 are arranged on the front surface of the base layer 31 so as to face the individual electrodes 15, respectively. Note that the terminal 19 may be a pad as a copper foil for soldering.

The through-holes 33 are provided at the rear surfaces of the terminals 19, respectively. The through-hole 33 is a through-hole which extends through the base layer 31 in the Z-direction. The through-hole 33 is filled with a conductive material. The plurality of through-holes 33 are respectively joined to the rear traces 35.

The backing member 21 is provided on the rear surface of the lower layer FPC 39. The backing member 21 mechanically supports the plurality of transducer elements 23. The backing member 21 damps the plurality of transducer elements 23 to shorten ultrasonic pulses to be emitted. The thickness of the backing member 21 is set to a thickness sufficient for the wavelength of ultrasonic waves to be used so as to maintain good acoustic characteristics, that is, to a thickness that can sufficiently attenuate ultrasonic waves in the rear surface direction.

The cover-lays 45 are films which respectively cover the surroundings of the plurality of FPCs located between the position where they lead from the front surface of the backing member 21 and the position where they are connected to the electronic circuit boards (not shown), in order to insulate and protect the FPCs. As a material for the cover-lays 45, for example, polyimide is used. The cover-lays 45 covers the upper layer FPC 37 and lower layer FPC 39 which are located between the position where they lead from the front surface of the backing member 21 and the position where they are connected to the electronic circuit boards (not shown).

The connection portions 17 connect the plurality of terminals 19 arranged at the front surfaces of the upper layer FPC 37 and lower layer FPC 39 to the plurality of individual electrodes 15 located on the front surfaces of the plurality of terminals 19, respectively. The connection portions 17 have acoustically the same function as that of the backing member 21, which attenuates ultrasonic waves. The connection portion 17 has a thickness corresponding to the distance between the individual electrode 15 and the terminal 19 to which the connection portion 17 is connected. The thickness of the connection portion 17 varies depending on the distance between the individual electrode 15 and the terminal 19 to which the connection portion 17 is connected. The connection portion 17 is made of a material having acoustic impedance lower than that of the intermediate layer 13, in order to reduce the acoustic influence based on thickness. The connection portion 17 is made of, for example, a material having conductivity such as a solid conductive material containing carbon. In addition, the connection portion 17 may be made of copper or gold having a length equal to the distance between the terminal 19 to which the connection portion 17 is connected and the individual electrode 15. Note that the connection portion 17 may be a bump made of copper or gold having a length corresponding to the distance between the terminal 19 to which the connection portion 17 is connected and the individual electrode 15.

The structure of the plurality of FPCs stacked on each other and located at the front surface of the backing member 21 will be described below. The plurality of FPCs stacked on each other are bonded to each other with an adhesive. The upper layer FPC 37 of the plurality of FPCs bonded to each other is notched to expose the plurality of terminals 19, located on the front surface of the lower layer FPC 39, to the individual electrodes 15 connected to the connection portions 17 (this structure will be referred to as the notched structure hereinafter). Note that the upper layer FPC 37 may be placed to expose the plurality of terminals 19, located on the front surface of the lower layer FPC 39, to the individual electrodes 15 connected to the connection portions 17. The upper FPC and lower FPC have a level difference t as shown in FIG. 2.

The thickness of the connection portion 17 is adjusted in advance such that when the level difference t between the upper FPC and the lower FPC is combined with the thickness of the connection portion 17, as shown in FIG. 2, the resultant thickness becomes uniform (thickness t in FIG. 2) in the Z-direction. Forming the structure of the plurality of FPCs stacked on each other into a notched structure can use a plurality of doubled-sided FPCs with a simple structure in a manufacturing process. This can suppress the manufacturing cost of FPCs as compared with multilayer FPCs. In addition, separating the upper layer FPC 37 and the lower layer FPC 39 facilitates handling of the respective FPCs in the ultrasonic probe, unlike a multilayer FPC. Furthermore, the areas of connection between the plurality of electronic circuit boards and the plurality of rear traces of the respective FPCs can be made smaller than the areas of connection between the multilayer FPC and the plurality of electronic circuit boards. This can reduce the outer dimensions of the ultrasonic probe according to this embodiment as compared with those of an ultrasonic probe using a multilayer FPC.

Figure 14:
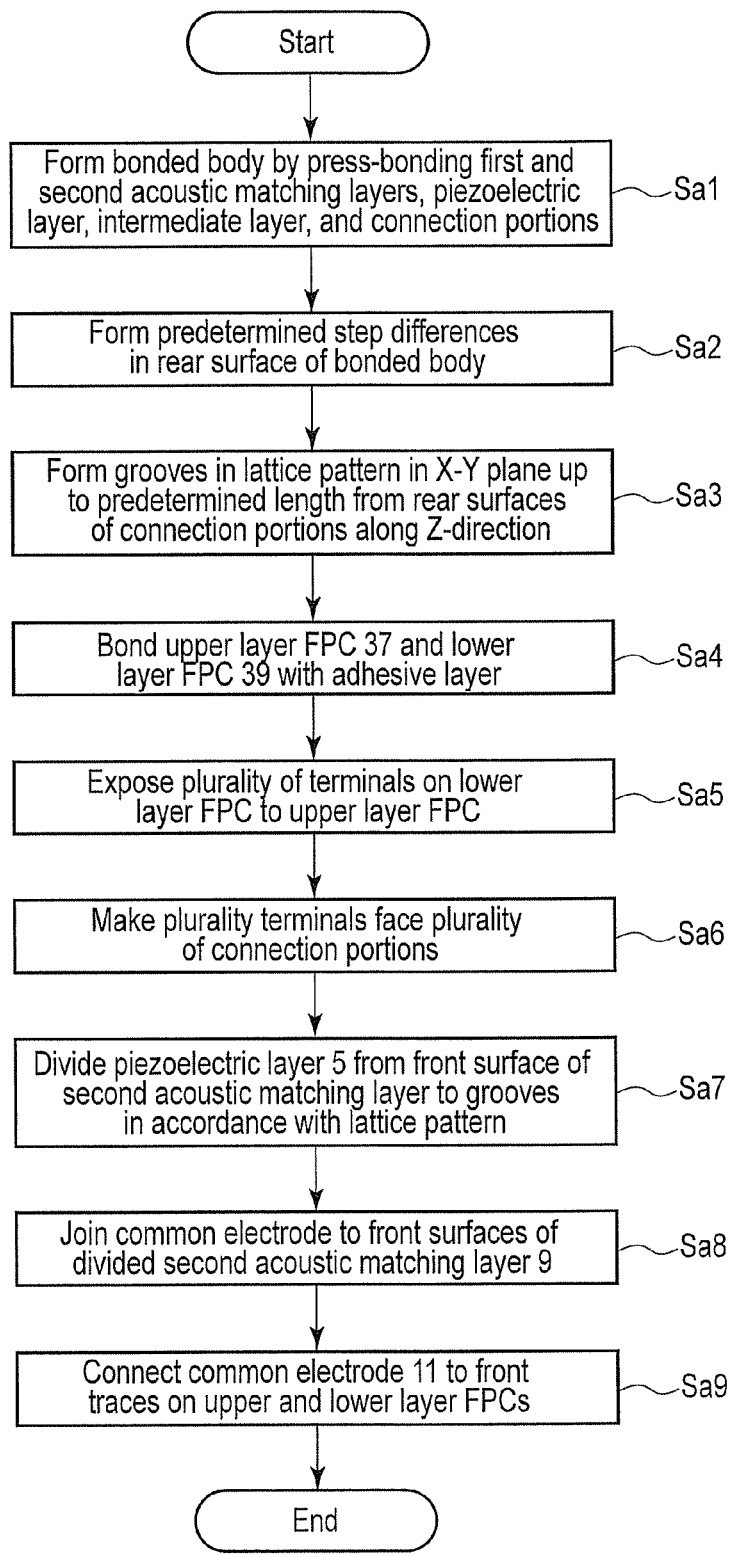
FIG. 14 is a flowchart showing a procedure for manufacturing an ultrasonic probe according to this embodiment.

A process of manufacturing the first embodiment will be described below with reference to FIG. 14.

The flat second acoustic matching layer 9, the first acoustic matching layer 7, the piezoelectric layer 5, the intermediate layer 13, the electrode before being divided into the individual electrodes 15, and the connection layer having a predetermined thickness are sequentially press-bonded to each other (step Sa1). A structure obtained by press bonding will be referred to as a bonded body hereinafter. The connection layer is a layer before being divided into a lattice pattern (described later) to form the connection portions 17. The predetermined thickness is, for example, a thickness larger than t in FIG. 2.

Note that the connection layer may be bonded to a partial region of the above electrode. In this case, predetermined second electrodes of the second electrodes are joined to predetermined electrodes which face the predetermined second electrodes. For example, in FIG. 2, the predetermined second electrodes are second electrodes 15a and 15b located near the position where the stacked FPCs (upper layer FPC 37 and lower layer FPC 39) are led from the ultrasonic probe. Notching is performed from the rear surfaces of the press-bonded connection portions 17 in the Z-direction by using a tool such as an end mill to form a predetermined step t (step Sa2).

Note that the processing in steps Sa1 and Sa2 may be the following processing. The connection layer is divided into a lattice pattern to form the plurality of connection portions 17. The respective connection portions 17 are classified into a plurality of groups. Different thicknesses are determined for the connection portions 17 of the respective groups. The bonded body is formed by using the connection portions 17 having the thickness.

Grooves are formed in a lattice pattern in the X-Y plane up to a predetermined length (depth) from the rear surfaces of the connection portions 17 along the Z-direction (step Sa3). The predetermined length is shorter than the distance from the rear surfaces of the connection portions 17 to the press-bonded intermediate layer. With this processing, the individual electrodes 15 are formed. The upper layer FPC 37 is bonded to the lower layer FPC 39 with the adhesive layer 41 (step Sa4). The upper layer FPC 37 is notched. This notching makes the lower layer FPC 39 extend longer than the upper layer FPC 37 to expose the plurality of terminals 19 (step Sa5). The plurality of terminals 19 are made to face the plurality of connection portions 17, respectively (step Sa6). The piezoelectric layer 5 is divided, from the front surface of the second acoustic matching layer 9 to the above grooves along the Z-direction so as to match the above lattice pattern (step Sa7). The second acoustic matching layer 9 is joined to the front surfaces of the divided bonded bodies (step Sa8). The front traces 43 of the upper layer FPC 37 and lower layer FPC 39 are connected to the common electrode 11 (step Sa9). With this process, the ultrasonic probe according to the first embodiment is manufactured.

(First Modification)

The first modification differs from the first embodiment in that the plurality of transducer elements 23 are arrayed in a square pattern, and the stacked FPCs are led from the front surface of the backing member 21 in the X- and Y-directions, when the plurality of transducer elements 23 arrayed in a lattice pattern are viewed from the ultrasonic wave emitting surface side.

Figure 5:
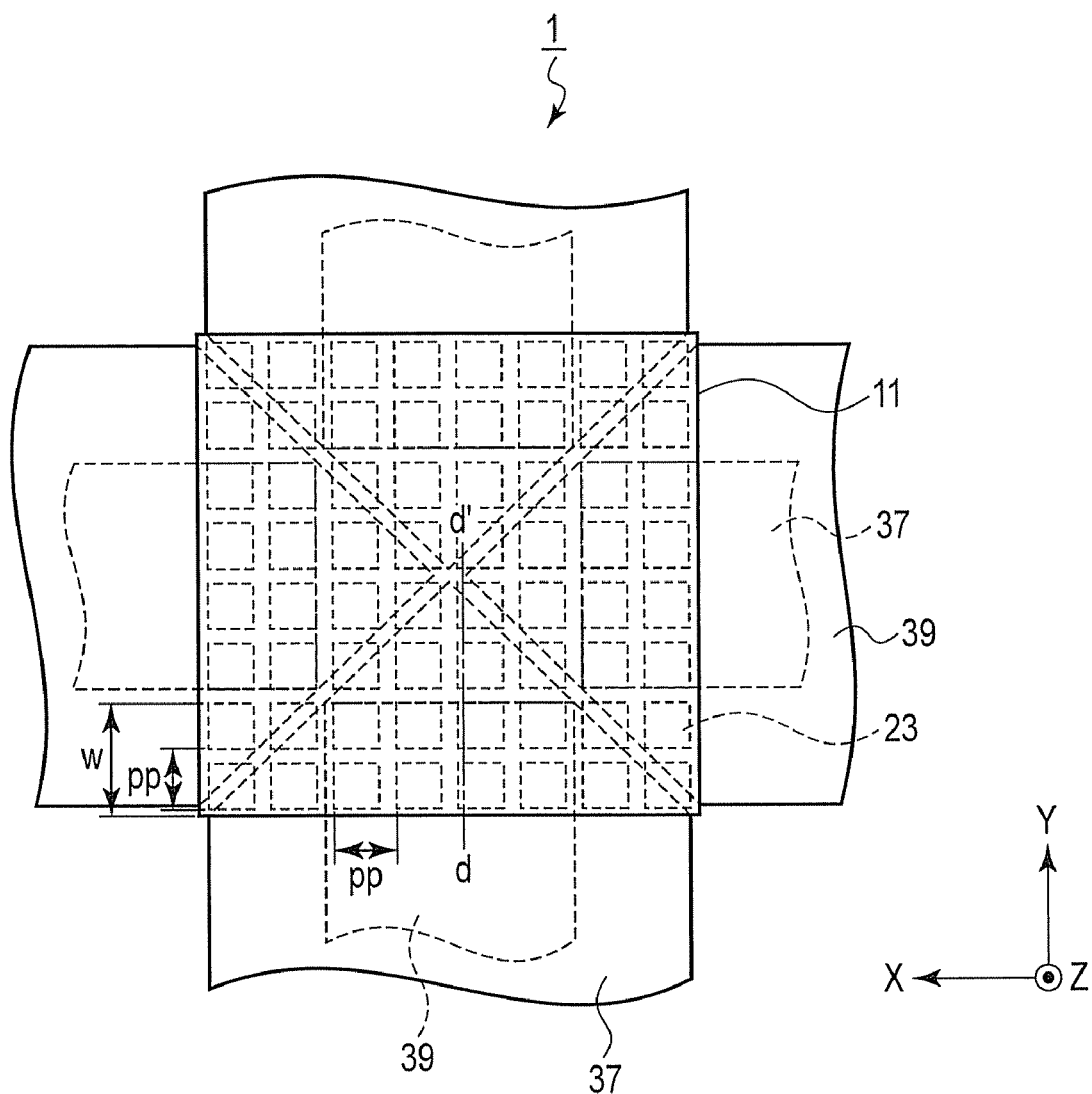
FIG. 5 is a view showing an ultrasonic probe according to the first modification of the first embodiment when viewed from the ultrasonic wave emitting surface side.

FIG. 5 is a view showing an ultrasonic probe according to the first modification of the first embodiment when viewed from the ultrasonic wave emitting surface side. The number of transducer elements 23 arrayed in the X-direction is equal to that in the Y-direction. As a consequence, the shape obtained by arraying the plurality of transducer elements 23 and the shape of the common electrode 11 in the X-Y plane become square in shape, as shown in FIG. 5. In addition, the bonded upper layer FPC 37 and lower layer FPC 39 are led from the front surface of the backing member 21 in four directions from outer edges corresponding to the respective sides of the above square. FIG. 2 shows an example of a cross-section of the ultrasonic probe 1 taken along a line d-d' in FIG. 5 when viewed from the X-direction, and the structure of the cross-section is the same as that in the first embodiment.

The ultrasonic probe according to the first modification can be applied to, for example, an ultrasonic probe to be used in a body cavity.

(Second Modification)

The second modification differs from the first embodiment in that the ultrasonic probe 1 includes three layers as FPCs. The two of the three layers as the FPCs which are closer to the backing member 21 are notched to expose the plurality of terminals 19 located at the front surface of the lower layer of the two layers as the FPCs to the individual electrodes 15 connected by the connection portions 17. Note that the two of the three layers as the FPCs may be arranged to expose the plurality of terminals 19 located at the front surface of the lower layer FPC of the two layers as the FPCs to the individual electrode 15 connected by the connection portions 17.

Figure 6:
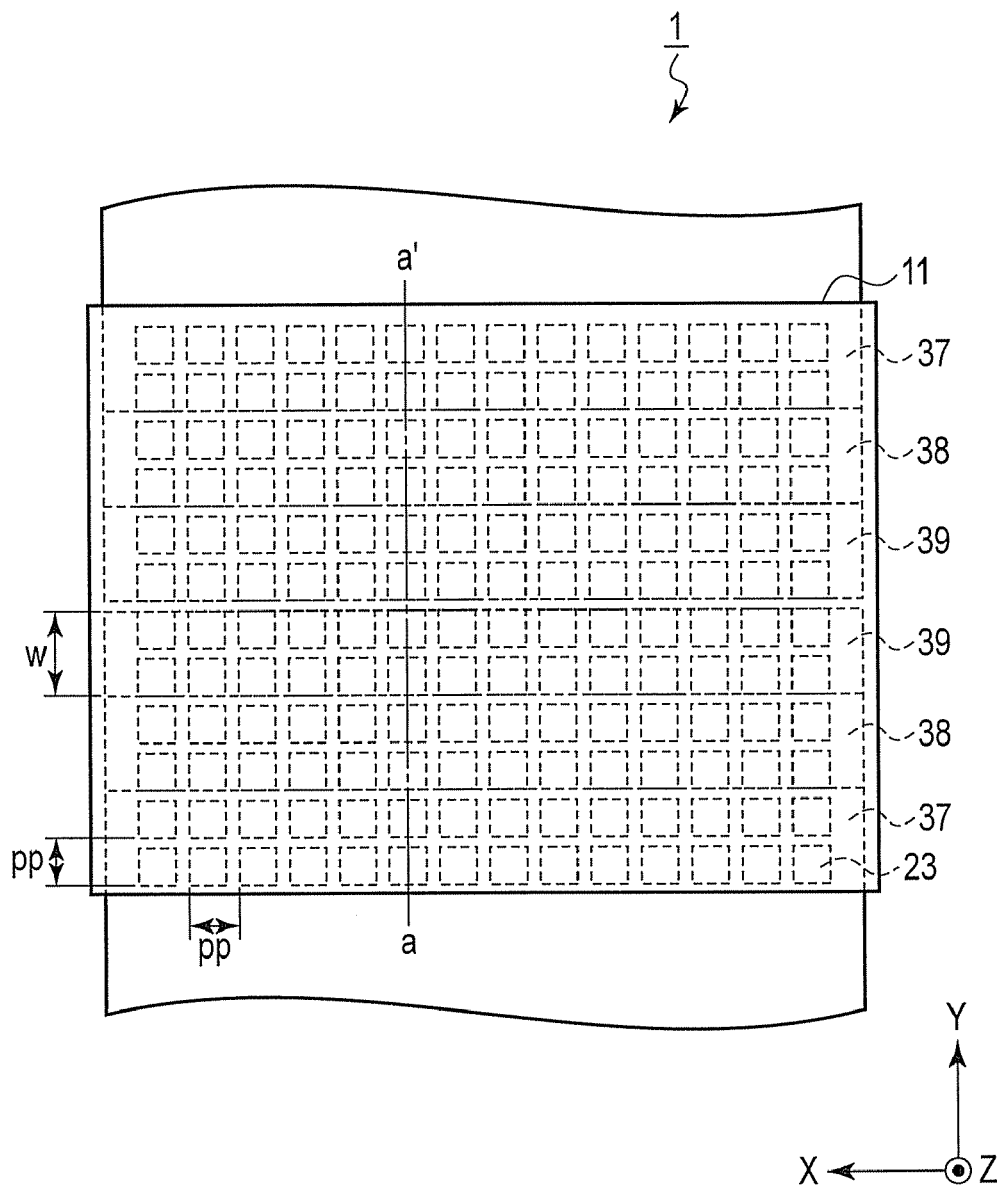
FIG. 6 is a view showing an ultrasonic probe according to the second modification of the first embodiment when viewed from the ultrasonic wave emitting surface side.

FIG. 6 is a view showing an ultrasonic probe according to the second modification of the first embodiment when viewed from the ultrasonic wave emitting surface side. As shown in FIG. 6, the three layers as the FPCs have a structure in which the lower layer FPC 39 is bonded to the front surface of the backing member 21, an intermediate layer FPC 38 is bonded to the front surface of the lower layer FPC 39, and the upper layer FPC 37 is bonded to the front surface of the intermediate layer FPC 38.

Figure 7:
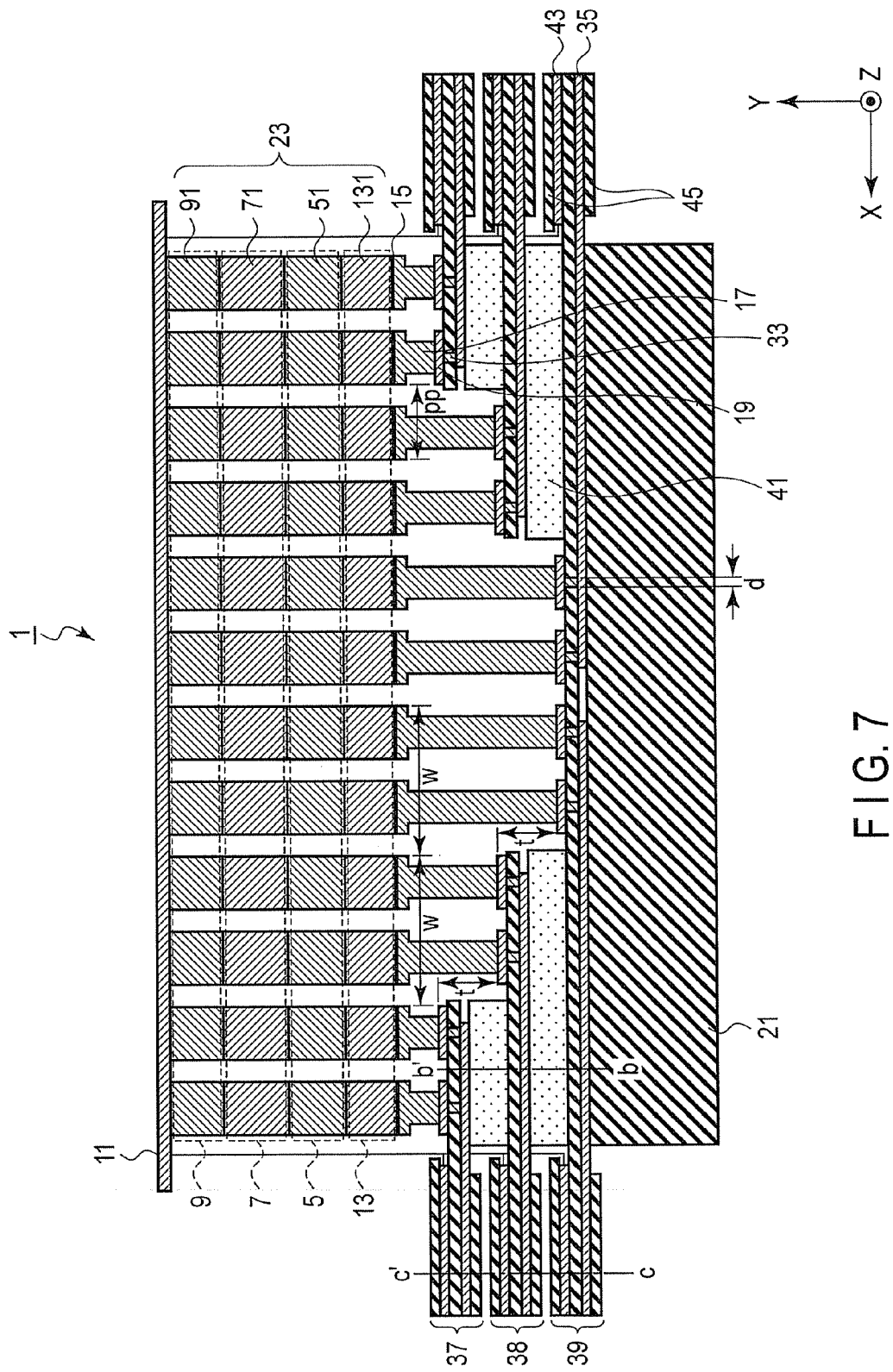
FIG. 7 is a sectional view of the ultrasonic probe according to the second modification in FIG. 6 taken along a line a-a' when viewed from the X-direction.

FIG. 7 is a view showing an example of a cross-section of the ultrasonic probe 1 taken along a line a-a' in FIG. 6 when viewed from the X-direction. The second modification differs from the first embodiment in that the three layers as the FPCs are located between the plurality of individual electrodes 15 and the backing member 21. The upper layer FPC 37 is notched to expose the terminals 19 of the intermediate layer FPC 38 to the individual electrodes 15. The intermediate layer FPC 38 is notched to expose the terminals 19 of the lower layer FPC 39 to the individual electrodes 15. The three layers as the FPCs leading from between the transducer elements 23 and the front surface of the backing member 21 along the X-direction are separated from each other.

Figure 8:
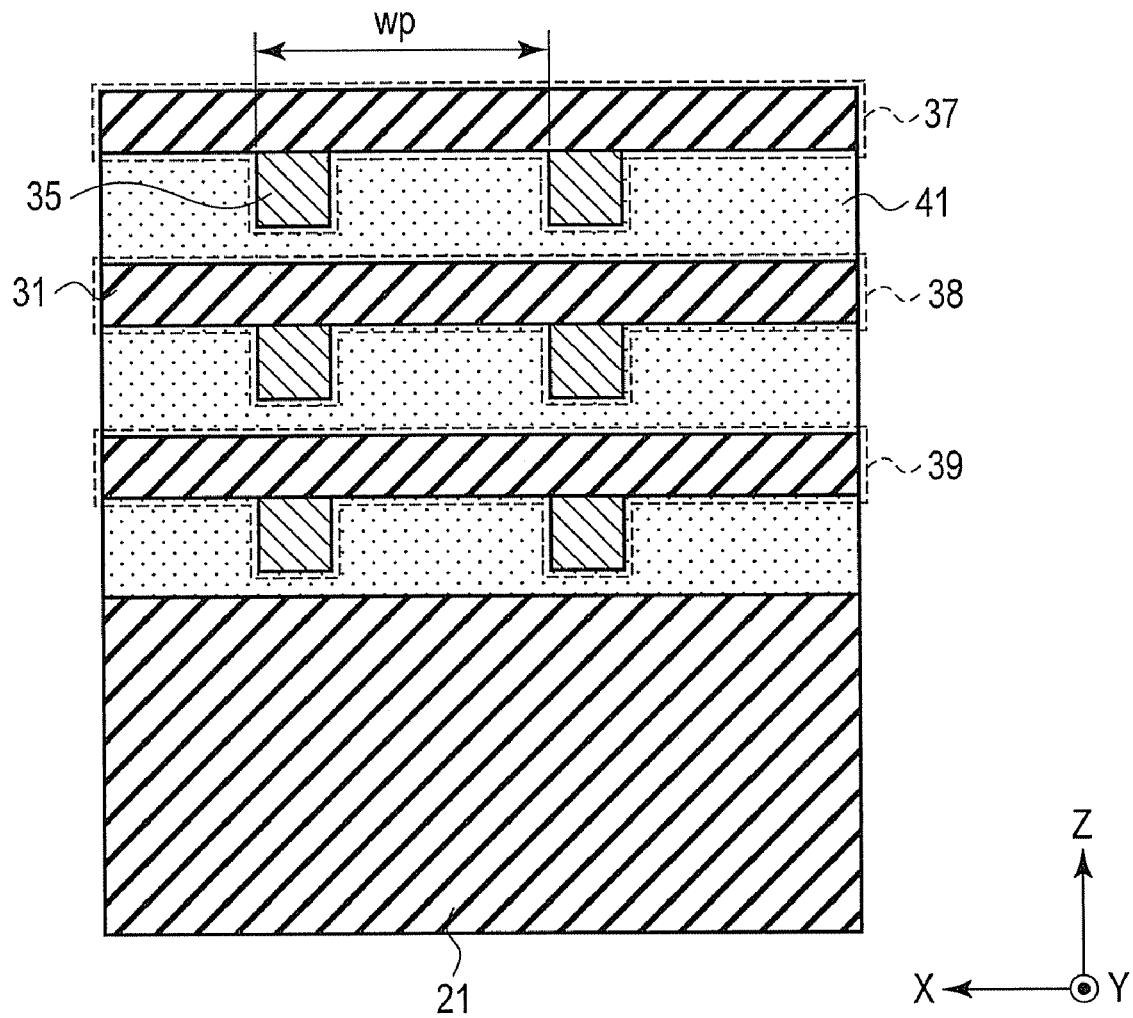
FIG. 8 is a sectional view taken along a line b-b' in FIG. 7 when viewed from the Y-direction.

FIG. 8 is a sectional view taken along a line b-b' in FIG. 7 when viewed from the Y-direction. This cross-section differs from that in FIG. 3 in that the intermediate layer FPC 38 is located between the upper layer FPC 37 and the lower layer FPC 39.

Figure 9:
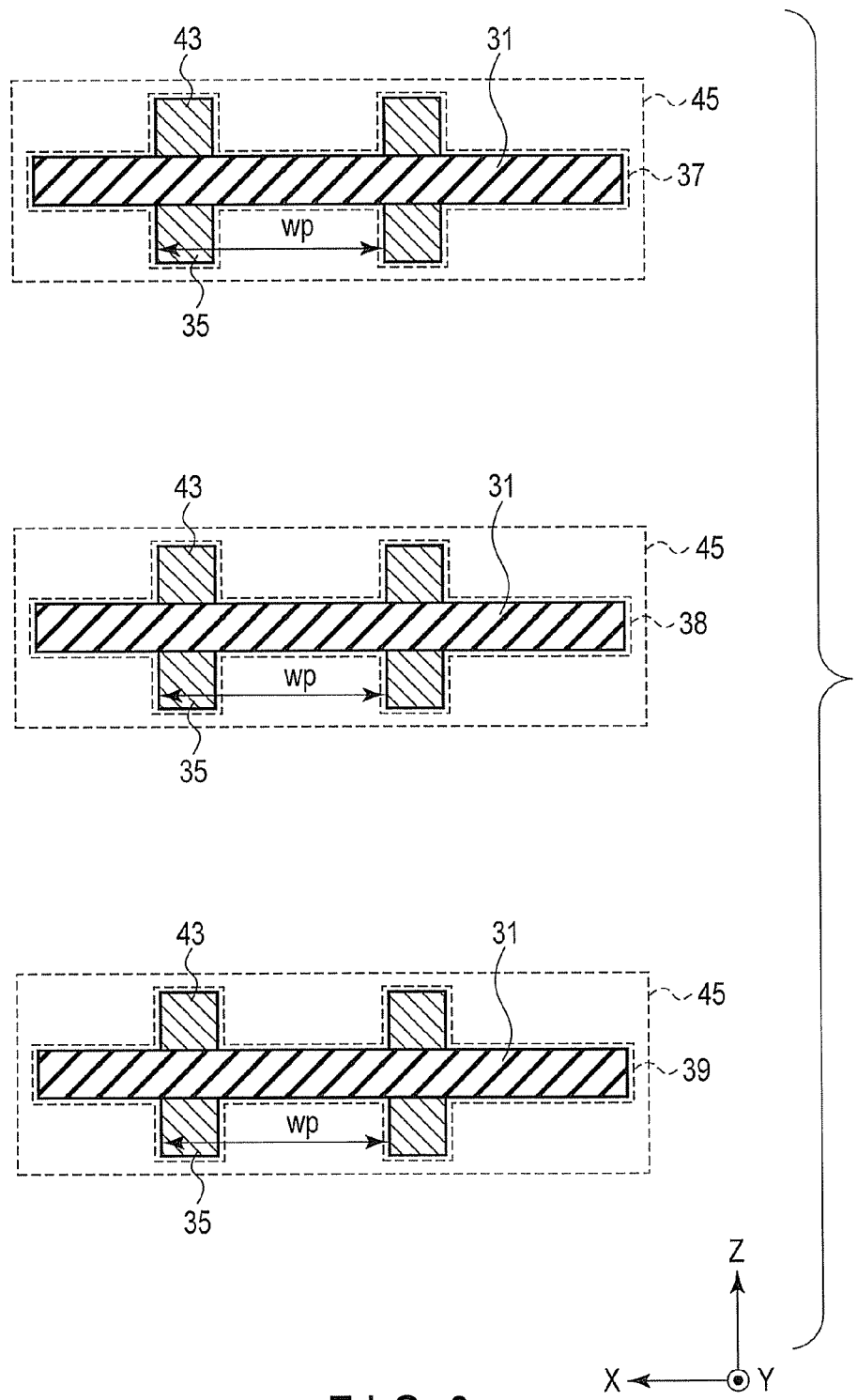
FIG. 9 is a sectional view taken along a line c-c' in FIG. 7 when viewed from the Y-direction.
Figure 11:
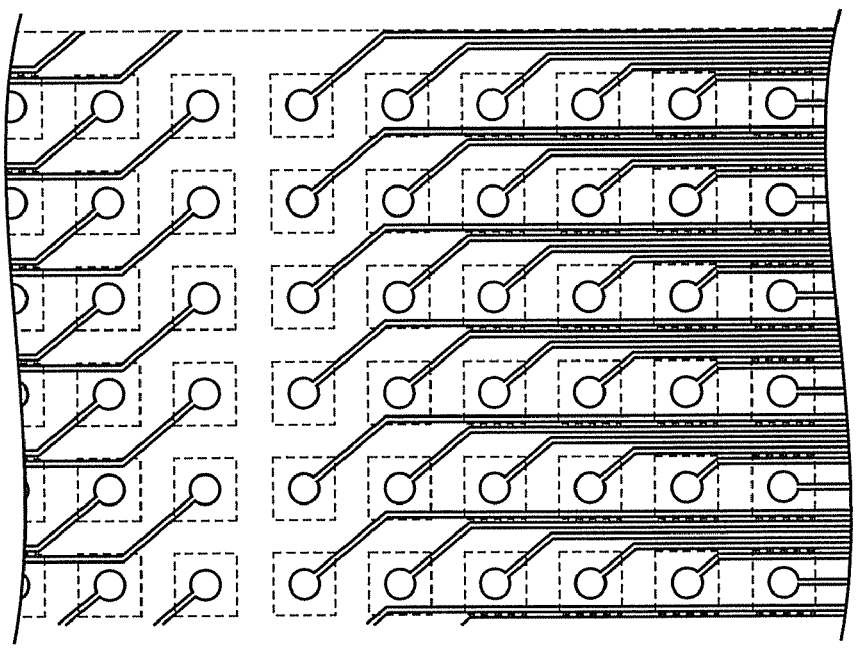
FIG. 11 is a view showing an example of the wiring pattern of an FPC in a conventional ultrasonic probe.
Figure 12:
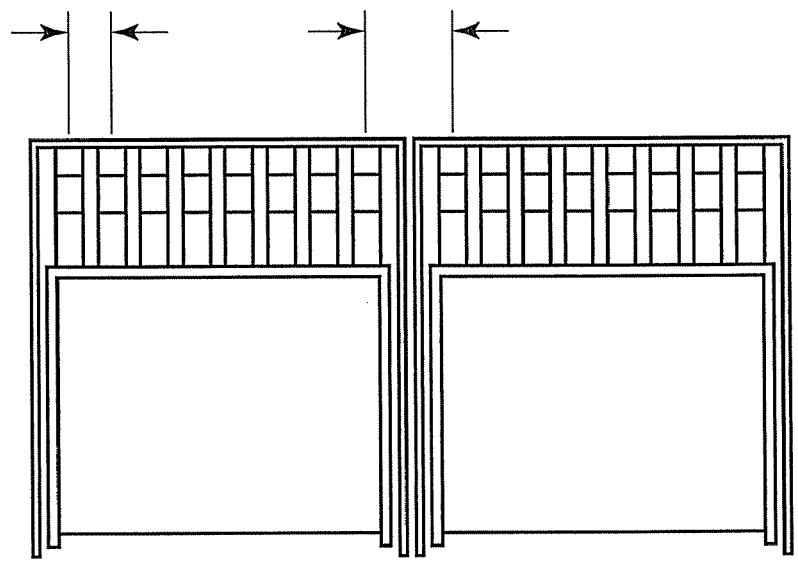
FIG. 12 is a view showing an example of how the overall array of the conventional ultrasonic probe is divided into a plurality of modules.
Figure 13:
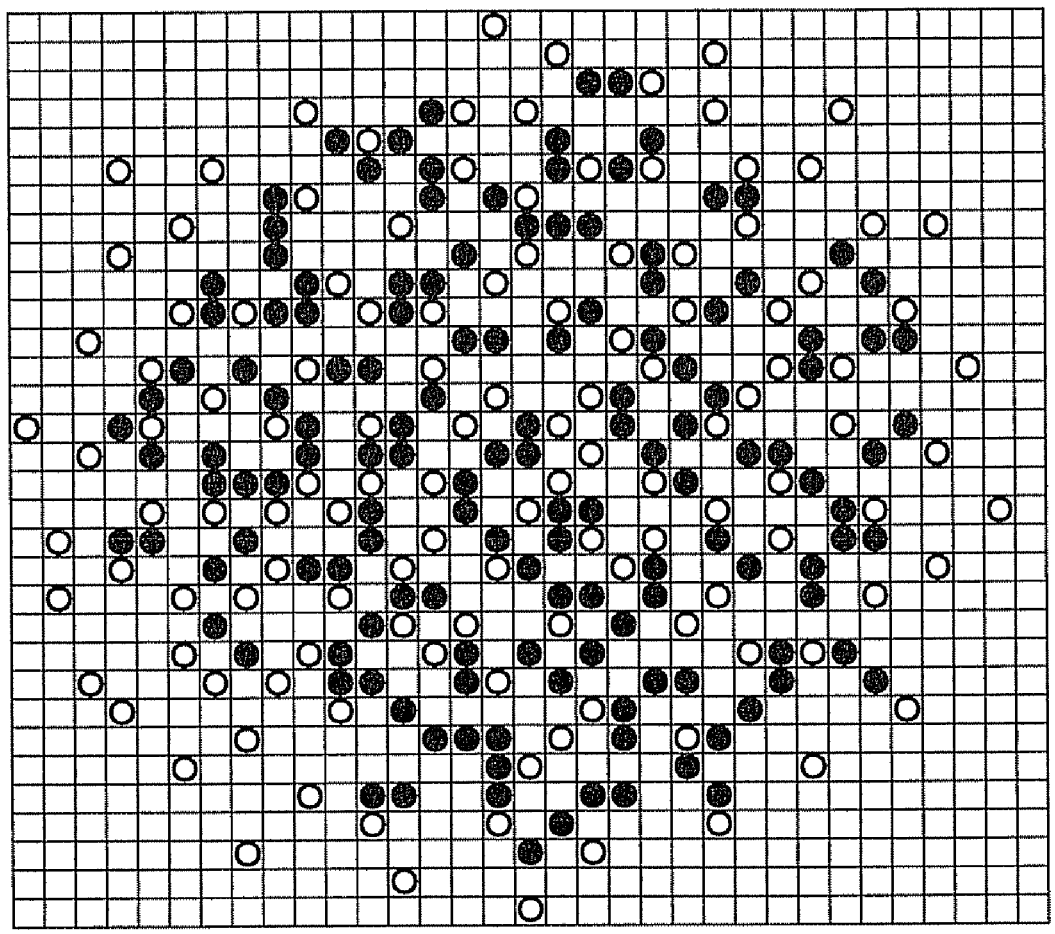
FIG. 13 is a view showing an example of a sparse array to which the sparse technique is applied in the conventional ultrasonic probe when viewed from the ultrasonic wave emitting surface side.

FIG. 9 is a sectional view taken along a line c-c' in FIG. 7 when viewed from the Y-direction. This cross-section differs from that in FIG. 3 in that the intermediate layer FPC 38 is located between the upper layer FPC 37 and the lower layer FPC 39.

The second modification can be applied to an ultrasonic probe having an aperture larger than that in the first embodiment.

Note that the above notched structure can be applied to four or more layers as FPCs to increase the aperture of the ultrasonic probe.

(Third Modification)

The third modification differs from the first embodiment in that the ultrasonic probe 1 includes three layers as FPCs, the plurality of transducer elements 23 are arrayed in a square pattern, and the stacked FPCs are led from the front surface of the backing member 21 in the X- and Y-directions, when the plurality of transducer elements 23 arrayed in a lattice pattern are viewed from the ultrasonic wave emitting surface side.

FIG. 10 is a view showing an ultrasonic probe according to the third modification of the first embodiment when viewed from the ultrasonic wave emitting surface side. As shown in FIG. 10, the three layers as the FPCs have a structure in which the lower layer FPC 39 is bonded to the front surface of the backing member 21, the intermediate layer FPC 38 is bonded to the front surface of the lower layer FPC 39, and the upper layer FPC 37 is bonded to the front surface of the intermediate layer FPC 38. The number of transducer elements 23 arrayed in the X-direction is equal to that in the Y-direction. As a consequence, the shape obtained by arraying the plurality of transducer elements 23 and the shape of the common electrode 11 in the X-Y plane become square in shape, as shown in FIG. 10. In addition, the bonded upper layer FPC 37 and lower layer FPC 39 are led from the front surface of the backing member 21 in four directions from outer edges corresponding to the respective sides of the above square. FIG. 7 shows an example of a cross-section of the ultrasonic probe 1 taken along a line d-d' in FIG. 10 when viewed from the X-direction, and the structure of the cross-section is the same as that in the second modification.

The ultrasonic probe according to the third modification can be applied to, for example, an ultrasonic probe which has an aperture larger than that in the first modification and is used in a body cavity.

The following is a summary of the effects of the first embodiment and of the first to third modifications.

According to this ultrasonic probe, making a plurality of stacked FPCs have a notched structure can use a plurality of double-sided FPCs allowing a simple manufacturing process. This makes it possible to suppress the manufacturing cost of FPCs as compared with a case in which multilayer FPCs are used. Separating a plurality of stacked FPCs from each other facilitates handling of each FPC in the ultrasonic probe. In addition, the areas of connection between a plurality of electronic circuit boards and a plurality of rear traces of the respective FPCs can be made smaller than the areas of connection between a multilayer FPC and a plurality of electronic circuit boards. This can reduce the outer dimensions of the ultrasonic probe according to this embodiment as compared with those of an ultrasonic probe using a multilayer FPC. Furthermore, placing the intermediate layer 13 between the piezoelectric layer 5 and the individual electrodes 15 can reduce the acoustic influence of the connection portions 17 having different thicknesses.

As described above, the ultrasonic probe according to this embodiment does not use module division, the sparse technique, and a multilayer FPC, and hence can solve the problems posed by module division, the sparse technique, and a multilayer FPC. For example, not using the sparse technique and module division will improve the positional accuracy of the transducer elements 23 and reduce the adverse effects on an acoustic field and reception sensitivity. Since no multilayer FPC is used, there is no need to form through-holes between the layers as the FPCs. This allows formation of high-density traces at a low cost. These can improve the performance of an ultrasonic probe. In addition, since there is no need to directly connect electronic circuit boards to the transducer elements 23, there is no need to develop any dedicated IC (application-specific integrated circuit [ASIC]) complying with the specifications of an ultrasonic probe. Furthermore, it is possible to execute part of the processing for ultrasonic transmission/reception associated with all the transducer elements 23 by using a plurality of ICs while suppressing the area of each IC. These make it possible to suppress development cost and manufacturing cost. The FPCs in this ultrasonic probe can be led from the front surface of the backing member 21 in the X- and Y-directions. This allows the embodiment to be applied to an ultrasonic probe used in a body cavity. In addition, the above notched structure can be applied to an ultrasonic probe having an arbitrary aperture.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An ultrasonic probe comprising:
   a plurality of arrayed piezoelectric elements;
   a first electrode provided on an emitting surface side of the plurality of piezoelectric elements;
   a plurality of second electrodes respectively provided on rear surface sides of the plurality of piezoelectric elements;
   a plurality of stacked flexible printed circuit boards respectively including a plurality of terminals; and
   a plurality of connection portions configured to electrically connect predetermined ones of the second electrodes to predetermined ones of the terminals;
   wherein at least one of the flexible printed circuit boards extends longer than the flexible printed circuit board serving as an upper layer.

2. The probe according to claim 1, wherein the connection portions electrically connect the second electrodes to the terminals, respectively.

3. The probe according to claim 1, wherein the predetermined second electrode of the second electrodes is joined to the predetermined terminal facing the predetermined second electrode.

4. The probe according to claim 1, wherein each of the connection portions includes a thickness corresponding to an interval by which the second electrodes and the terminals to be connected are away from each other.

5. The probe according to claim 1, wherein each of the terminals at positions facing the respective connection portions is exposed from the flexible printed circuit board.

6. The probe according to claim 1, further comprising an intermediate layer located between each of the second electrodes and each of the piezoelectric elements and having an acoustic impedance higher than an acoustic impedance of the piezoelectric element.

7. The probe according to claim 1, wherein the connection portions comprise a solid conductive material including carbon.

8. The probe according to claim 1, wherein each of the connection portions comprises copper or gold and has a length corresponding to an interval between the second electrode and the terminal which are electrically connected.

9. The probe according to claim 1, wherein each of the flexible printed circuit boards is bonded to a rear surface of the connection portion through an adhesive layer.

* * * * *